(12) United States Patent
Park et al.

(10) Patent No.: US 9,326,424 B2
(45) Date of Patent: Apr. 26, 2016

(54) HEAT SINK ASSEMBLY AND METHOD OF UTILIZING A HEAT SINK ASSEMBLY

(71) Applicant: OpenTV, Inc., San Francisco, CA (US)

(72) Inventors: Joonyoung Park, Mountain View, CA (US); Haejoo Lee, Songnam (KR); Jihyun Park, Mountain View, CA (US); Kiyoung Lee, Songnam (KR); Junseo Lee, Seoul (KR)

(73) Assignee: OpenTV, Inc., San Francisco, CA (US)

(*) Notice: Subject to any disclaimer, the term of this patent is extended or adjusted under 35 U.S.C. 154(b) by 0 days.

(21) Appl. No.: 14/482,533

(22) Filed: Sep. 10, 2014

(65) Prior Publication Data

US 2016/0073551 A1    Mar. 10, 2016

(51) Int. Cl.
*H05K 7/20* (2006.01)
*H05K 1/02* (2006.01)

(52) U.S. Cl.
CPC .......... *H05K 7/20418* (2013.01); *H05K 1/0203* (2013.01)

(58) Field of Classification Search
USPC ................................ 361/704, 707, 690, 688
See application file for complete search history.

(56) References Cited

U.S. PATENT DOCUMENTS

| 5,218,516 A | 6/1993 | Collins et al. |
| 2004/0114330 A1 | 6/2004 | Yazawa |
| 2007/0195489 A1 | 8/2007 | Lai et al. |
| 2009/0116195 A1 | 5/2009 | Yang et al. |
| 2009/0223647 A1* | 9/2009 | Alousi et al. ........ F28D 15/0233 165/80.3 |
| 2012/0000625 A1* | 1/2012 | Tan ........................ H01L 23/36 165/80.1 |

FOREIGN PATENT DOCUMENTS

| EP | 0946085 A1 | 9/1999 |
| EP | 0948248 A1 | 10/1999 |

OTHER PUBLICATIONS

European Patent Office, PCT Application No. PCT/US2015/049194, Notification of International Search Report and Written Opinion of the International Searching Authority mailed Feb. 2, 2016, 11 pages (OPTV L0003PCT).

* cited by examiner

*Primary Examiner* — Andargie M Aychillhum
(74) *Attorney, Agent, or Firm* — Lowenstein Sandler LLP

(57) ABSTRACT

A heat sink assembly and a method of utilizing a heat sink assembly where the heat sink assembly is configured to dissipate air from the bottom of the heat sink assembly to the top of the heat sink assembly utilizing a plurality of vents to cool a desired electrical component.

18 Claims, 8 Drawing Sheets

HEAT SINK ASSEMBLY AND METHOD OF UTILIZING A HEAT SINK ASSEMBLY

FIELD OF THE DISCLOSURE

The present disclosure relates generally to a heat sink assembly and a method of utilizing a heat sink assembly. In particular, a heat sink assembly configured to dissipate air in a direction from the bottom of the heat sink assembly to the top of the heat sink assembly utilizing a plurality of vents to cool a desired electrical component.

BACKGROUND OF THE DISCLOSURE

Heat sink assemblies are well-known. Specifically, heat sink assemblies are used to cool electrical components within a device as such electronics components may operate at a fast rate to fit consumer's needs. In other words, a heat sink assembly is an object that disperses heat to another object to prevent such electrical components from overheating. Thus, the heat sink assembly keeps the electronics operating.

Currently, various heat sink assemblies exist such as liquid cooled, phase-change, and air-cooled. With respect to liquid cooled, liquid cooled heat sink assemblies utilize a pump to move coolant through the system and a radiator to dispel heat into the air as well as other components such as a fan, coolant reservoir, and hose to facilitate operation of the system. Typically, water is used in liquid cooled systems and is pumped through the electronics within the hose. The coolant or water absorbs heat from the electrical components as it passes the electronics components.

With respect to phase-change, phase-change heat sink assemblies use a compressor, vaporizer, radiating element, and pump to condense a refrigerant gas into a liquid which is then turned into a gas to absorb heat from the electrical components as the gas passes through the components. While air-cooled heat sink assemblies usually involve a cooling fan with aerodynamic fins in its design which allows rapid air flow through a system for cooling. The air flow is controlled by how much space is present between each fin. The thermal conductivity of the fins may also affect the ability to cool the electrical components. Additionally, all the assemblies use a plurality of screws, nuts, bolts, and the like to assemble the heat sinks.

However, both water-cooled heat sink assemblies and phase-cooled heat sink assemblies have various disadvantages. For example, water cooled assembly may leak depending on how the system is set up. Thus, water cooled systems are not ideal or efficient for every device. Also, phase-change systems are very complex and may be expensive to implement. Additionally, as stated above, air-cooled assemblies may or may not be efficient or effectively cool a device based on the configuration of the assembly's fins. Furthermore, each assembly may be difficult to assemble based on the number of parts required for the heat sink.

As such, there is a need for an efficient, inexpensive, and less invasive heat sink assembly than current conventional assemblies which is also easy to assemble.

SUMMARY OF THE DISCLOSURE

An aspect of the present disclosure provides a heat sink assembly and a method of utilizing a heat sink assembly.

An aspect of the heat sink assembly may include a first heat sink. The first heat sink may have a top portion, a bottom portion, and a plurality of fins extending between the top portion and the bottom portion. The bottom portion of the first heat sink may have at least one tooth for receiving air. Additionally, the first heat sink may have at least one mechanism for receiving a fastener. A second heat sink may have at least one fastener for engaging and affixing the at least one mechanism of the first heat sink. The second heat sink may also have a top portion, a bottom portion, and a plurality of fins extending between the top portion and the bottom portion. The heat sink assembly may further include a casing disposed over the first heat sink and the second heat sink. The casing may have a top portion and a bottom portion. The bottom portion of the casing may have at least one vent for receiving air and the top portion may have at least one vent for releasing or dissipating air. The heat sink assembly may be designed to receive air through at least one of the at least one tooth of the first heat sink or the at least one vent of the bottom portion of the casing. Air may then flow upwardly through the plurality of fins of the first heat sink and the second heat sink to the top portion of the casing and through the at least one vent for releasing air to cool a desired electrical component. The first heat sink and second heat sink may absorb heat from the air as the air passes through the plurality of fins.

Another aspect of the heat sink assembly includes a heat sink. The heat sink may have a top portion, a bottom portion, and a plurality of fins extending between the top portion and the bottom portion. The bottom portion may also have at least one tooth for receiving air to cool. A casing may be disposed over the heat sink. The casing may also have a bottom portion which may receive air and a top portion which may release air. When air flows upwardly through the plurality of fins of the heat sink, the plurality of fins may absorb heat as air passes through to the top portion of the casing and through the at least one vent to cooled a desired electrical component.

An aspect of a method of utilizing a heat sink assembly includes providing a heat sink with a top portion, a bottom portion, and a plurality of fins extending between the top portion and the bottom portion. Additionally, the bottom portion may have at least one tooth for receiving air. The method may further include providing a casing disposed over the heat sink. The casing may have a top portion and a bottom portion. The bottom portion may have at least one vent for receiving air and the top portion may have at least one vent for releasing air. The heat sink assembly may be configured to receive air through at least one of the at least one vent of the bottom portion of the casing and the at least one tooth of the bottom portion of the heat sink. Air may then flow upwardly through the plurality of fins of the heat sink to the top portion of the casing and through the at least one vent of the casing to cool a desired electrical component. The plurality of fins may absorb heat as the air flows through the heat sink.

The above and the other aspects of the present disclosure provide various advantages. For example, the heat sink assembly may be inexpensive as it is not as complex in nature compared to the prior assemblies described above, there is no risk of leaking or damaging electrical components as the heat sink assembly may be an air cooled heat sink assembly, and the heat sink assembly cools electronics components effective and efficiently.

BRIEF DESCRIPTION OF THE DRAWINGS

Other aspects of the present disclosure will be readily appreciated, as the same becomes better understood by reference to the following detailed description when considered in connection with the accompanying drawings wherein.

DETAILED DESCRIPTION OF THE ENABLING EMBODIMENTS

Detailed examples of the present disclosure are provided herein; however, it is to be understood that the disclosed examples are merely exemplary and may be embodied in various and alternative forms. It is not intended that these examples illustrate and describe all possible forms of the disclosure. Rather, the words used in the specification are words of description rather than limitation, and it is understood that various changes may be made without departing from the spirit and scope of the disclosure.

The aspects disclosed herein provide a heat sink assembly and method of utilizing a heat sink assembly. In particular, the heat sink assembly may be configured to dissipate air from the bottom of the heat sink assembly to the top of the heat sink assembly utilizing a plurality of vents to cool a desired electrical component.

As those of ordinary skill in the art will understand, various features of the present disclosure as illustrated and described with reference to any of the Figures may be combined with features illustrated in one or more other Figures to produce examples of the present disclosure that are not explicitly illustrated or described. The combinations of features illustrated provide representative examples for typical applications. However, various combinations and modifications of the features consistent with the teachings of the present disclosure may be desired for particular applications or implementations.

Figure 1A:
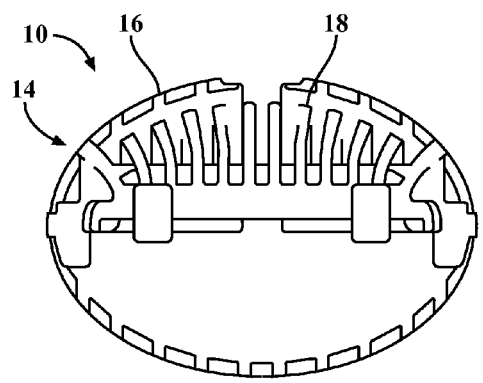
FIGS. 1A-B are illustrations of various views of a first heat sink of a heat sink assembly in accordance with the present disclosure.
Figure 1B:
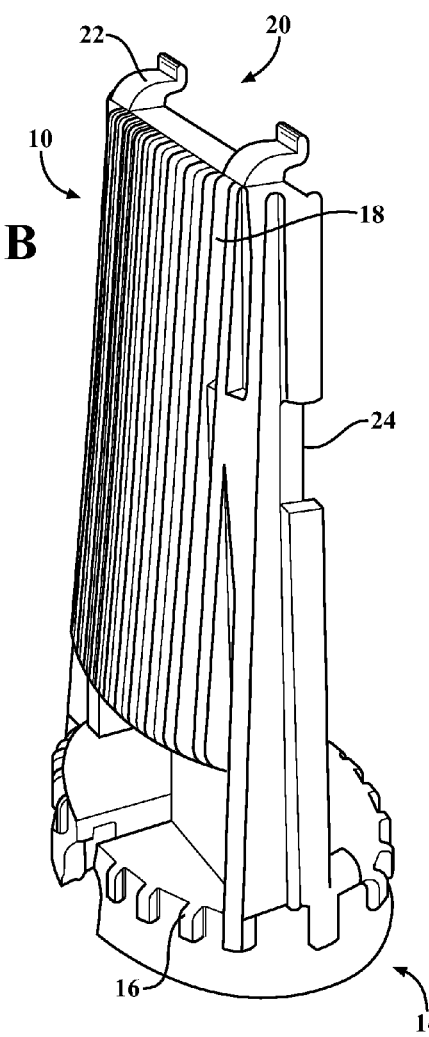

FIGS. 1A-B are illustrations of various views of a first heat sink 10 of a heat sink assembly 12 in accordance with the present disclosure. Specifically, FIG. 1A shows a bottom view of the first heat sink 10 and FIG. 1B shows a perspective view of the first heat sink 10 of the heat sink assembly 12. The first heat sink 10 may include a bottom portion 14. The bottom portion 14 may have a generally circular shape for receiving and/or attachment of a base (not shown) of the heat sink assembly 12. The bottom portion 14 may have at least one tooth 16 for receiving air to supply air through the heat sink assembly 12. According to an aspect, the bottom portion 14 may have a plurality of teeth and which may further have a saw-tooth configuration or any other type of tooth configuration which may have the ability to receive air. The at least one tooth 16 may surround the bottom portion 14 of the first heat sink 10.

The bottom portion 14 may also have a plurality of fins 18. The plurality of fins 18 may be made of an aluminum alloy, copper, or another thermally conductive material known in the art. The plurality of fins 18 also may be cylindrical, elliptical or square in shape, and may also have a pin, flared, or straight configuration along the first heat sink 10. The plurality of fins 18 may be configured to assist in removing or dispelling heat from electronics by absorbing the heat as air passes through the plurality of fins 18.

The first heat sink 10 of the heat sink assembly 12 may also include a top portion 20 as shown in FIG. 1B. The top portion 20 and the bottom portion 14 may extend upwardly and form a generally frusto-conical shape. The plurality of fins 18 may extend therebetween the top portion 20 and the bottom portion 14. The plurality of fins 18 may also generally increase or decrease in size as the plurality of fins 18 extend between the top portion 20 and the bottom portion 14. The first heat sink 10 may also have at least one hook 22 formed integrally with the top portion 20. The at least one hook 20 may extend upwardly from the top portion 20 of the first heat sink 12 and may form a generally U-, V-, or J-like shape. The at least one hook 22 may instead be a pair of hooks or a plurality of hooks for assembling the heat sink assembly 12. Additionally, as shown in FIG. 1B, the first heat sink 10 may have at least one mechanism 24 for receiving a tab or locking mechanism (not shown) formed therein.

Figure 2:
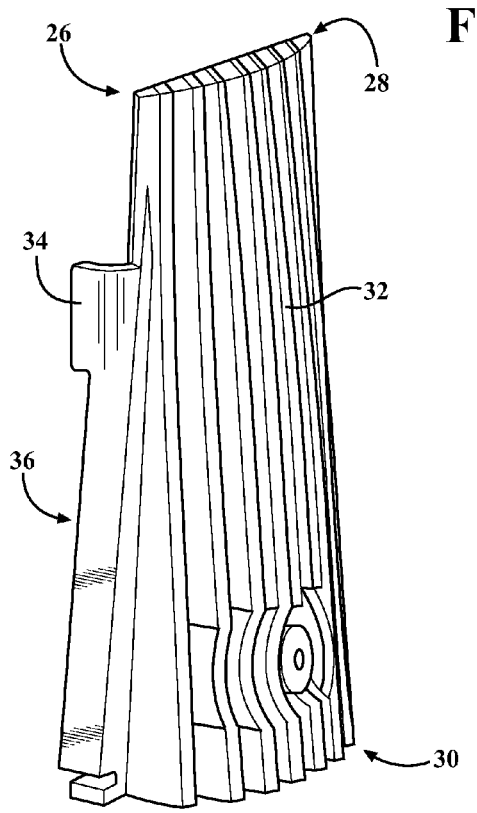
FIG. 2 is a perspective view of a second heat sink of a heat sink assembly in accordance with the present disclosure.

FIG. 2 is a perspective view of a second heat sink 26 of a heat sink assembly 12 in accordance with the present disclosure. The second heat sink 26 may have a top portion 28 and a bottom portion 30 and may have a plurality of fins 32 extending between the top portion 28 and the bottom portion 30. Similar to the first heat sink 12, the plurality of fins 32 of the second heat sink 26 may be made of an aluminum alloy, copper, or another thermally conductive material known in the art. The plurality of fins 32 also may be cylindrical, elliptical or square in shape, and may also have a pin, flared, or straight configuration along the second heat sink 26. The plurality of fins 32 may be configured to assist in removing or dispelling heat from electronics by absorbing the heat as air passes through the plurality of fins 32. The second heat sink 26 may further include at least one tab or locking mechanism 34 disposed along at least one side 36 and/or bottom portion 30 of the second heat sink 26 for engaging and attaching the second heat sink 26 to the first heat sink 12. The first and second heat sinks may be attached in a variety of other suitable ways.

Figure 3:
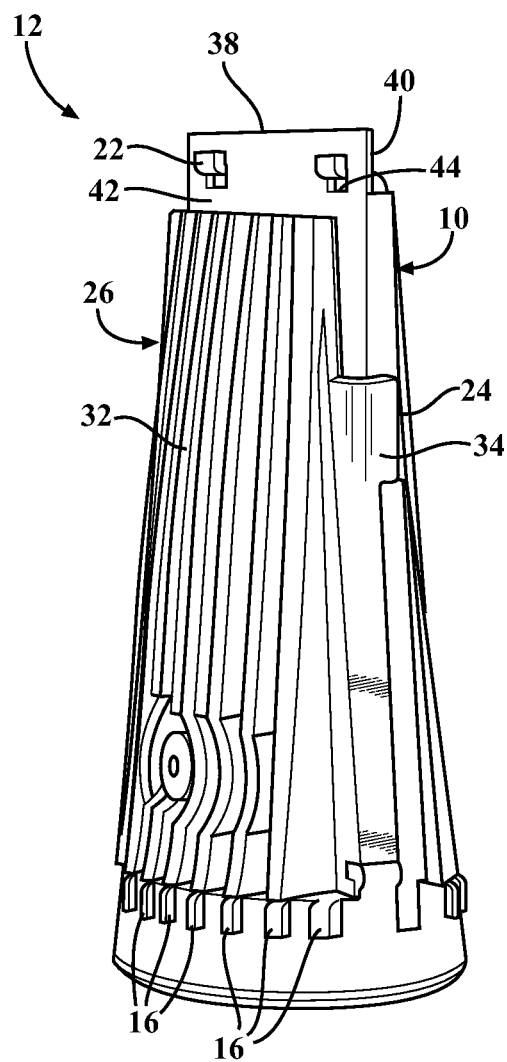
FIG. 3 is an illustration of the first heat sink and second heat sink of a heat sink assembly in accordance with the present disclosure.

FIG. 3 is an illustration of the first heat sink 10 and the second heat sink 26 of a heat sink assembly 12 in accordance with an aspect of the present disclosure. The heat sink assembly 12 may include the first heat sink 10 and the second heat sink 26 as described above in FIGS. 1A-2. The first heat sink 10 and the second heat sink 26 may form as a generally frusto-conical shape as shown in FIG. 3. In particular, the first heat sink 10 may be affixed to a PCB board 38. The PCB board 38 may have a first side 40 (not shown) and a second side 42. The PCB board 38 may also have at least one aperture 44 extending there through for receiving the at least one hook 22 of the first heat sink 10. In attachment, the first heat sink 10 may be adjacent to the first side 40 of the PCB board 38 with the at least one hook 22 extending through the at least one aperture 44. The second heat sink 26 may be disposed adjacent to the second side 42 of the PCB board 38 and opposite to the first heat sink 10. In other words, the PCB board 38 may be disposed between the first heat sink 10 and the second heat sink 26. Furthermore, the at least one tab or locking mechanism 34 may be received by the at least one mechanism 24 for receiving the at least one tab or locking mechanism 34.

Figure 4B:
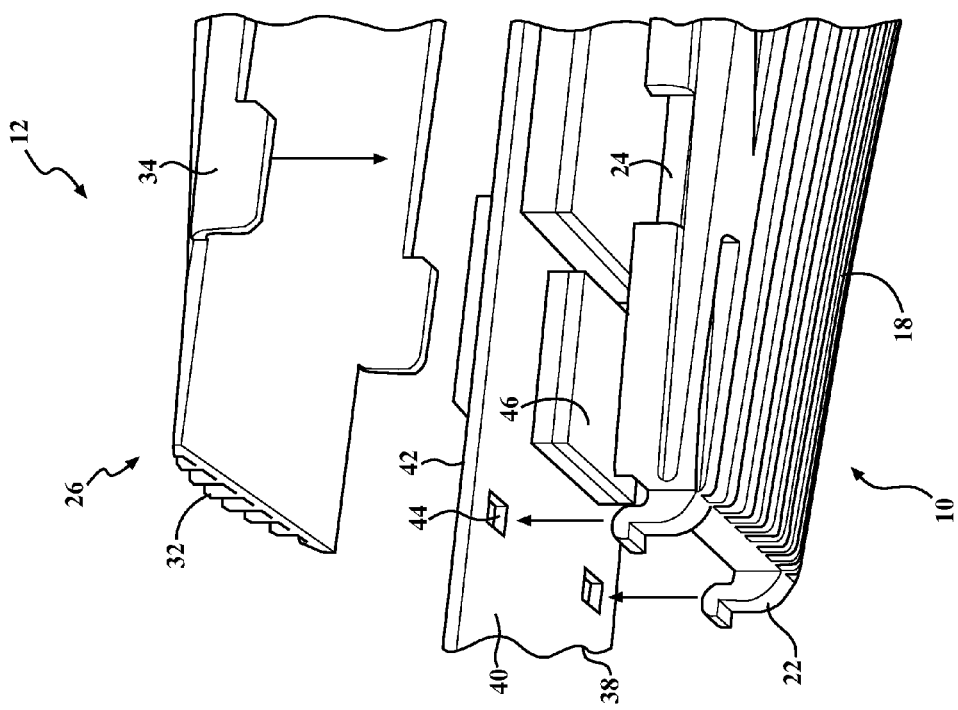
FIGS. 4A-B are illustrations of various views of assembling a heat sink assembly in accordance with the present disclosure.
Figure 4A:
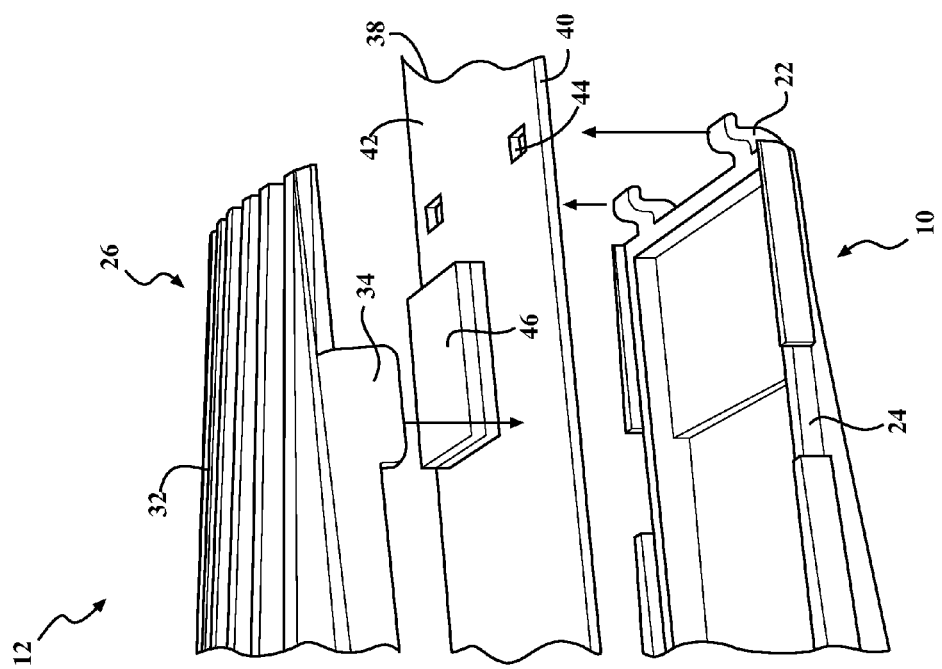

With respect to FIGS. 4A-B, illustrations of various views of assembling a heat sink assembly 12 in accordance with the present disclosure are provided. In particular, FIG. 4A and FIG. 4B illustrate the first heat sink 10 and the second heat sink 26 being assembled together with the PCB board 38 disposed between. In assembling the heat sink assembly 12, the at least one hook 22 may be inserted through the at least one aperture 44 of the PCB board 38, locking the first heat sink 10 into place. The first heat sink 10 may be disposed adjacent to the first side 40 of the PCB board 38. The second heat sink 26 may then be disposed adjacently to the second side 42 of the PCB board 38 and may be affixed to the first heat sink 10 via at least one tab or locking mechanism 34 of the second heat sink 26 and the at least one mechanism 24 for receiving the at least one tab or locking mechanism 34. Furthermore, at least one thermal pad 46 may be disposed between the first heat sink 10 and the PCB board 38 and/or the second heat sink 26 and the PCB board for receiving and absorbing heat as air passes through the plurality of fins 18 and 32 during operation of the heat sink assembly 12.

Figure 5:
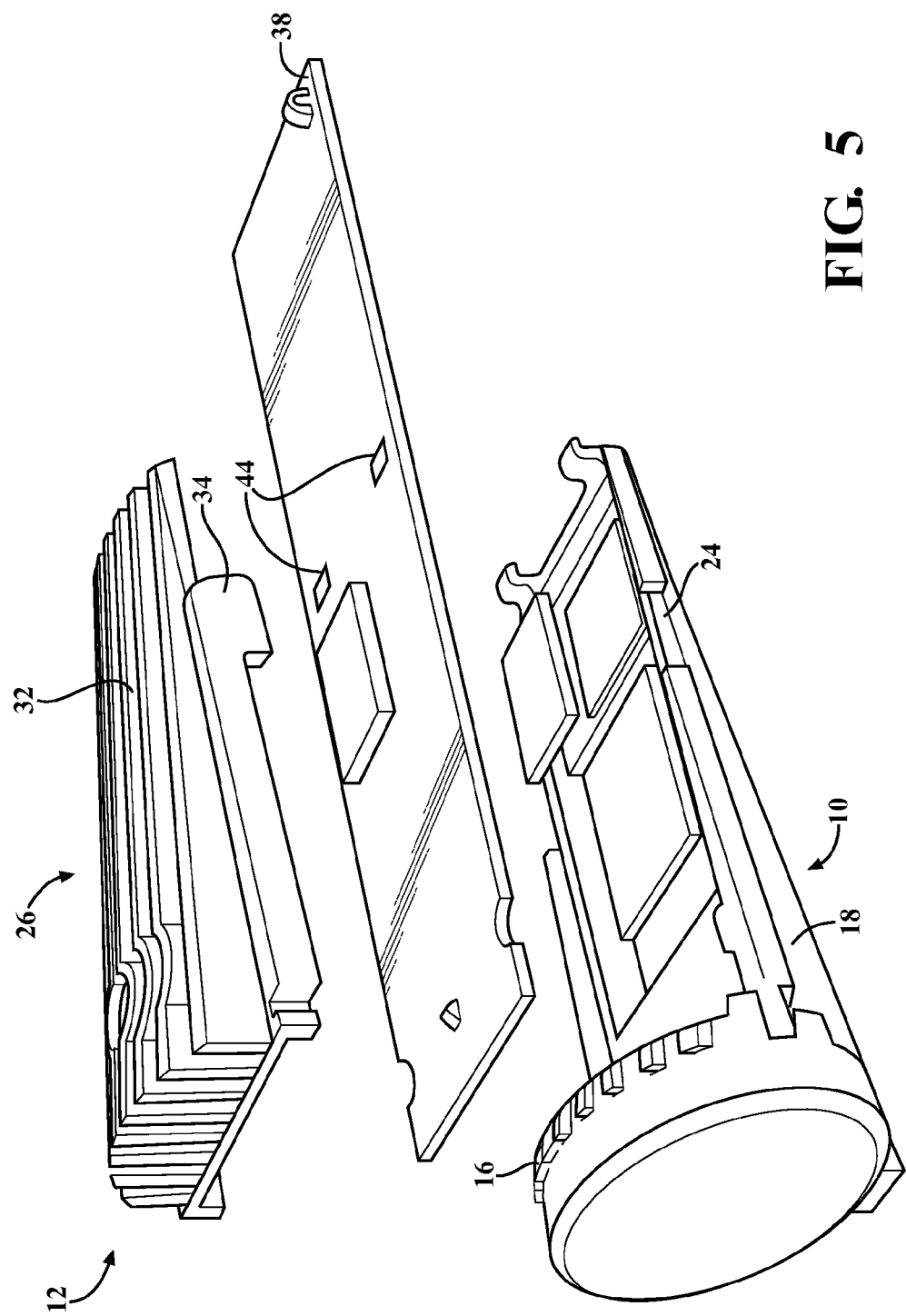
FIG. 5 is an illustration of an exploded view of a heat sink assembly in accordance with the present disclosure.

FIG. 5 illustrates an exploded view of the heat sink assembly 12 in accordance with an aspect of the present disclosure and in particular, FIG. 5 illustrates an exploded view of the assembled heat sink assembly 12 in greater detail. As described above, the PCB board 38 may be affixed to the first heat sink 10 through the at least one aperture 44 and the second heat sink 26 may be affixed to the first heat sink 10 through at least one tab or locking mechanism 34 around the edge of the PCB board 38.

Figure 6A:
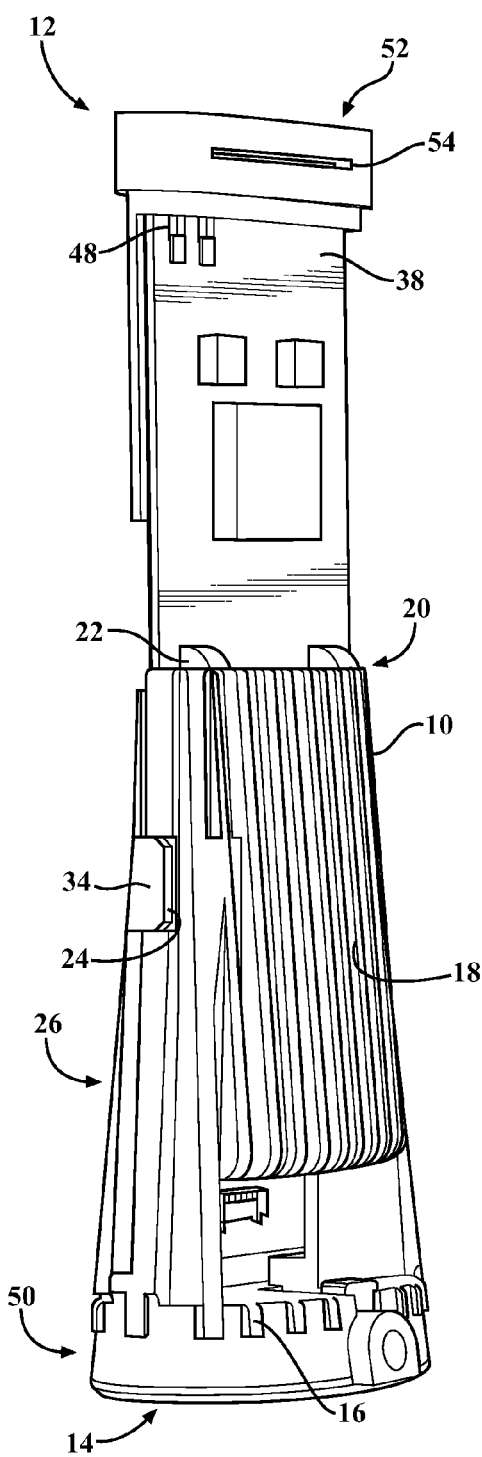
FIGS. 6A-B are illustrations of perspective views of a heat sink assembly in accordance with the present disclosure.
Figure 6B:
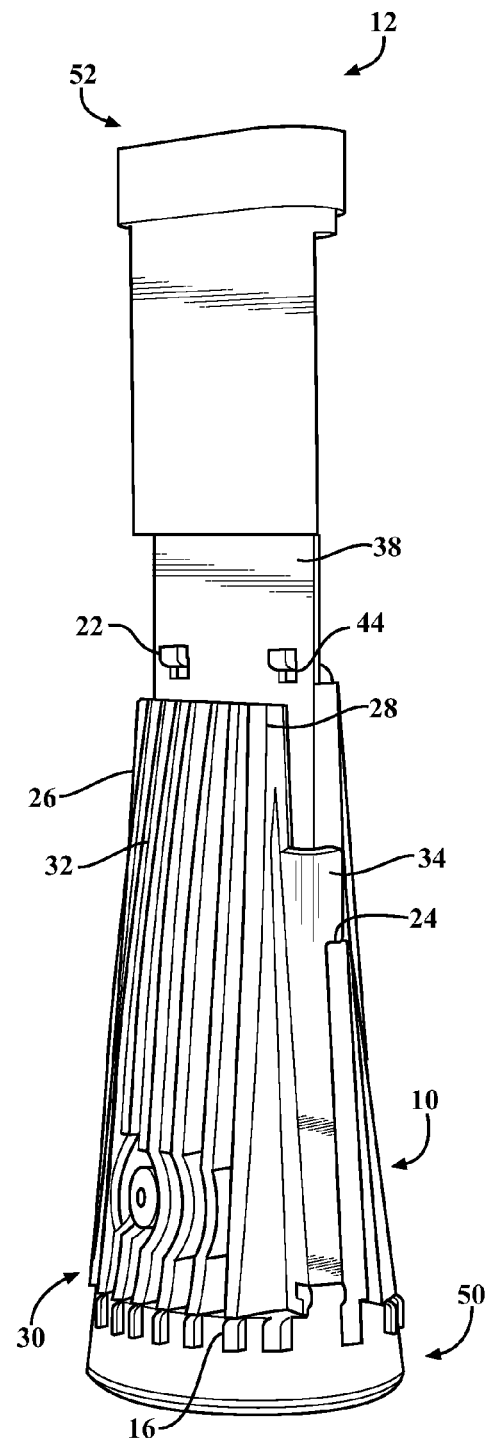

FIGS. 6A-B are illustrations of perspective views of a heat sink assembly 12 in accordance with the present disclosure. The heat sink assembly 12 may include a first heat sink 10 which may have a top portion 20 and a bottom portion 14 and a plurality of fins 18 extending therebetween. The first heat sink 10 may have at least one hook 20 formed integrally with the top portion 20 and may extend upwardly to form a generally U-, V-, or J-like shape. According to an aspect, the bottom portion 14 may have a generally circular shape and may have at least one tooth 16 formed therein. The at least one tooth 16 may consist of a plurality of teeth which can surround the bottom portion 14 of the first heat sink 10. The heat sink assembly 12 may also include a PCB board 38 having at least one aperture 44 for receiving the at least one hook 22 of the first heat sink 10, and may attach the first heat sink 10 to the PCB board 38. The PCB board 38 may include an antenna contact 48 for communication with various electronics. The heat sink assembly 12 may further include a second heat sink 26 which can have a top portion 28 and a bottom portion 30. A plurality of fins 38 may extend between the top portion 28 and the bottom portion 30. Furthermore, the second heat sink 26 may have at least one tab or locking mechanism 34 disposed on at least one side of the second heat sink 26. In assembly, the at least one tab or locking mechanism 34 of the second heat sink 26 may be received by the at least one mechanism 24 for receiving the tab or locking mechanism 34.

The heat sink assembly 12 may further include a base 50. The first heat sink 10 may be disposed over the base 50. Additionally, the heat sink assembly 12 may also include a first casing 52. The first casing 52 may have at least one vent 54. The at least one vent 54 may be an aperture or a plurality of apertures which release air as it is passed through the heat sink assembly 12. The first casing 52 may be an infrared lens and antenna case for communication purposes, including but not limited to, WI-FI. The first casing 52 may be disposed over the PCB board 38. Specifically, the first casing 52 may be in contact with or be adjacent to the antenna contact 48 of the PCB board 38.

Figure 7:
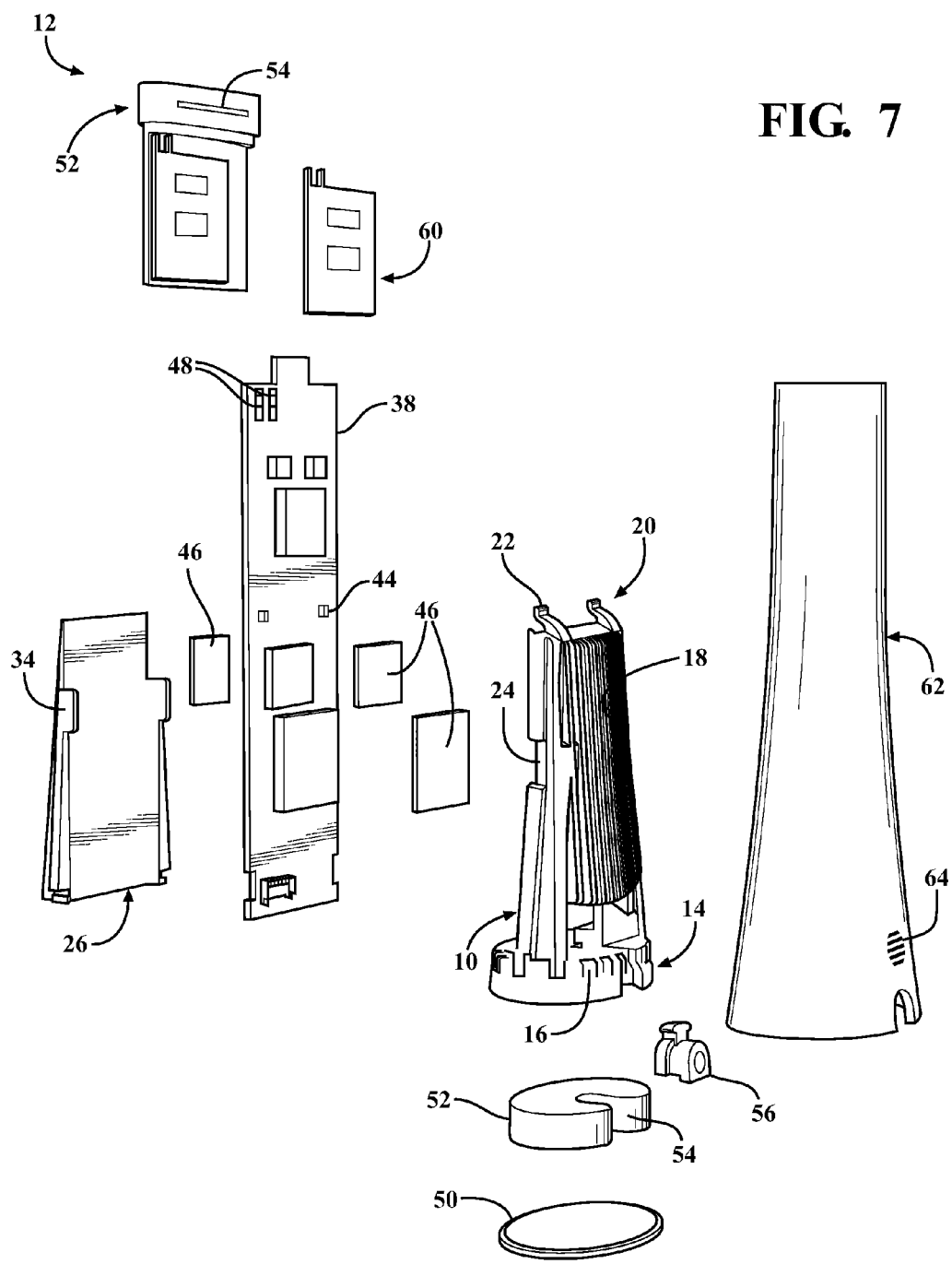
FIG. 7 is an exploded view of a heat sink assembly in accordance with the present disclosure.

FIG. 7 is an illustration of an exploded view of a heat sink assembly 12 in accordance with an aspect of the present disclosure. The heat sink assembly 12 can include a base 50.

The base 50 may be generally circular in shape and may be made of rubber. A weight insert 52 may be disposed on the base 50 to weigh down the base 50 or hold the base 50 in place. The weight insert 52 may have an aperture 54 for receiving a cable (not shown). A cable holder 56 may also be disposed within the aperture 54 of the weight insert 52 to hold the cable (not shown) in place. The first heat sink 10 may be disposed over and affixed to the base 50. The first heat sink 10 may have a bottom portion 14 and a top portion 20. Specifically, the bottom portion 14 may be disposed over the base 50. The bottom portion 14 may have at least one tooth 16. The at least one tooth 16 may be configured as a plurality of teeth. The plurality of teeth may surround the bottom portion 14 of the first heat sink 10. A plurality of fins 18 may extend between the top portion 20 and bottom portion 14 of the first heat sink 10. The plurality of fins 18 may be made of an aluminum alloy, copper, or another thermally conductive material known in the art. The plurality of fins 18 also may be cylindrical, elliptical or square in shape, and may also have a pin, flared, or straight configuration along the first heat sink 10. The plurality of fins 18 may be configured to assist in dispelling or removing heat from electronics by absorbing the heat as air passes through the heat sink assembly 12. The top portion 20 of the first heat sink 10 may have at least one hook 22 formed integrally within the first heat sink 10. The at least one hook 22 may be a plurality of hooks and may have a generally U-, V-, or J-like shape.

The heat sink assembly 12 may also include a PCB board 38. The PCB board 38 may have at least one aperture 44 for receiving the at least one hook 22. The PCB board 38 may have an antenna contact 48, as described above. The heat sink assembly 12 may further include a second heat sink 26 which may disposed opposite the first heat sink 10 and which may be disposed adjacent to the PCB board 38. The second heat sink 26 may have a plurality of fins 32 extending between the top portion 28 and the bottom portion 30 of the second heat sink 26. Additionally, at least one tab or locking mechanism 34 may be formed integrally with the second heat sink 26 on at least one side of the second heat sink 26. At least one thermal pad 46 may be disposed between at least one of the first heat sink 10 and the PCB board 38 or the second heat sink 26 and the PCB board 38. According to another aspect, an antenna 60 may be in communication with the antenna contact 48 of the PCB board 38. The antenna 60 may be capable of operating at, but is not limited to, 2.4 GHz or 5 GHz. Obviously, it may operate at a variety of other suitable frequencies. The heat sink assembly 12 may also include a first casing 52 disposed over the antenna 60 and the PCB board 38. The first casing 52 may have at least one vent 54 for releasing air that is passing through the heat sink assembly 12. The heat sink assembly 12 may further include a second casing 62 disposed over the first heat sink 10 and the second heat sink 26. The second casing 62 may be affixed to the base 50 of the heat sink assembly 12 and may also be affixed to the first casing 52. The second casing 62 may have at least one vent 64 for receiving air which may then pass through the first heat sink 10 and second heat sink 26.

In an aspect of the present disclosure, the heat sink assembly 12 may have a frusto-conical shape. However, one skilled in the art will appreciate that the heat sink assembly 12 may have a shape conducive to placement in any type of technology or product in which is it used. For example, the heat sink assembly 12 may be used in televisions, computers, laptops, smart devices, and the like. Additionally, other components may be used in conjunction with the heat sink assembly 12 such as, but not limited to, at least one fan (not shown). The at least one fan may be a plurality of fans.

Figure 8B:
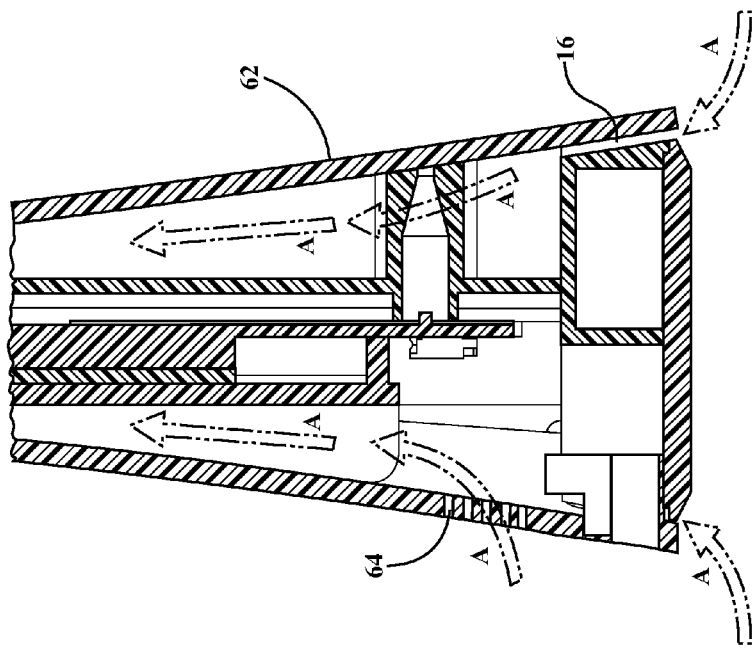
FIGS. 8A-B are illustrations of a heat sink assembly in accordance with the present disclosure.
Figure 8A:
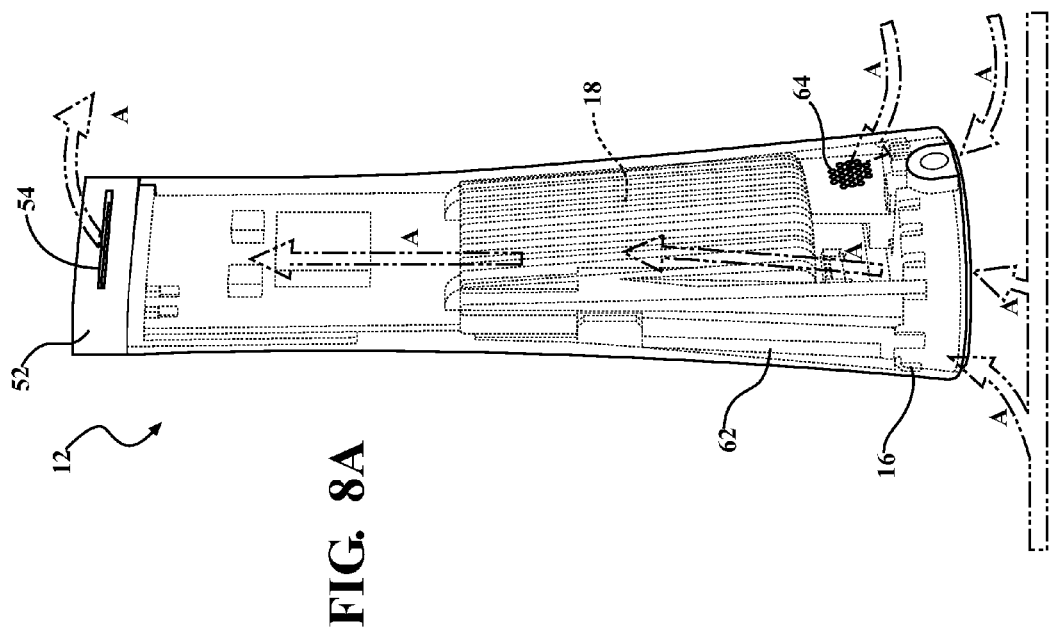

With respect to FIGS. 8A-B, illustrations of a heat sink assembly 12 in accordance with an aspect of the present disclosure are provided. In particular, FIG. 8A shows the movement or passage of air through the first heat sink 10 and the second heat sink 26 of the heat sink assembly 12 denoted by letter A. The air A may enter the heat sink assembly 12 through the at least one vent 64 of the second casing 62 and/or the at least one tooth 16 of the first heat sink 10. The air A may then travel upwardly through the plurality of fins 18 and 32 of the first heat sink 10 and the second heat sink 26. The plurality of fins 18 and 32 may be made of a thermally conductive material as discussed above and may absorb heat from the air A as the air A passes through. The air A may then exit through the at least one vent 54 of the first casing 52 to cool surrounding electronics. It will be appreciated that the air may enter and exit the casing at a variety of different locations.

FIG. 8B shows another view of the movement or passage of air A through the first heat sink 10 and the second heat sink 26 of the heat sink assembly 12. As described above, air A may enter the heat sink assembly 12 through the at least one tooth 16 or a plurality of teeth of the first heat sink 10 and/or may also enter through the at least on vent of the second casing. The air A may then travel up and through the plurality of fins 18 and 32 of the first heat sink 10 and the second heat sink 26 dispelling or removing heat from in the air A and may then dissipate through the at least one vent 54 of the first casing 52 of the heat sink assembly 12.

One skilled in the art will appreciate that the configuration shown in FIGS. 8A and 8B of air A traveling in a bottom to top or upwardly direction is merely exemplary and is not meant to be limiting. Additionally, one skilled in the art also appreciates that the air A may travel in the opposite direction and may travel from top to bottom or downwardly to cool the desired electronics. It will also be appreciated that the heat sink assembly may consist of more or less components than described and may have a variety of different configuration.

Figure 9:
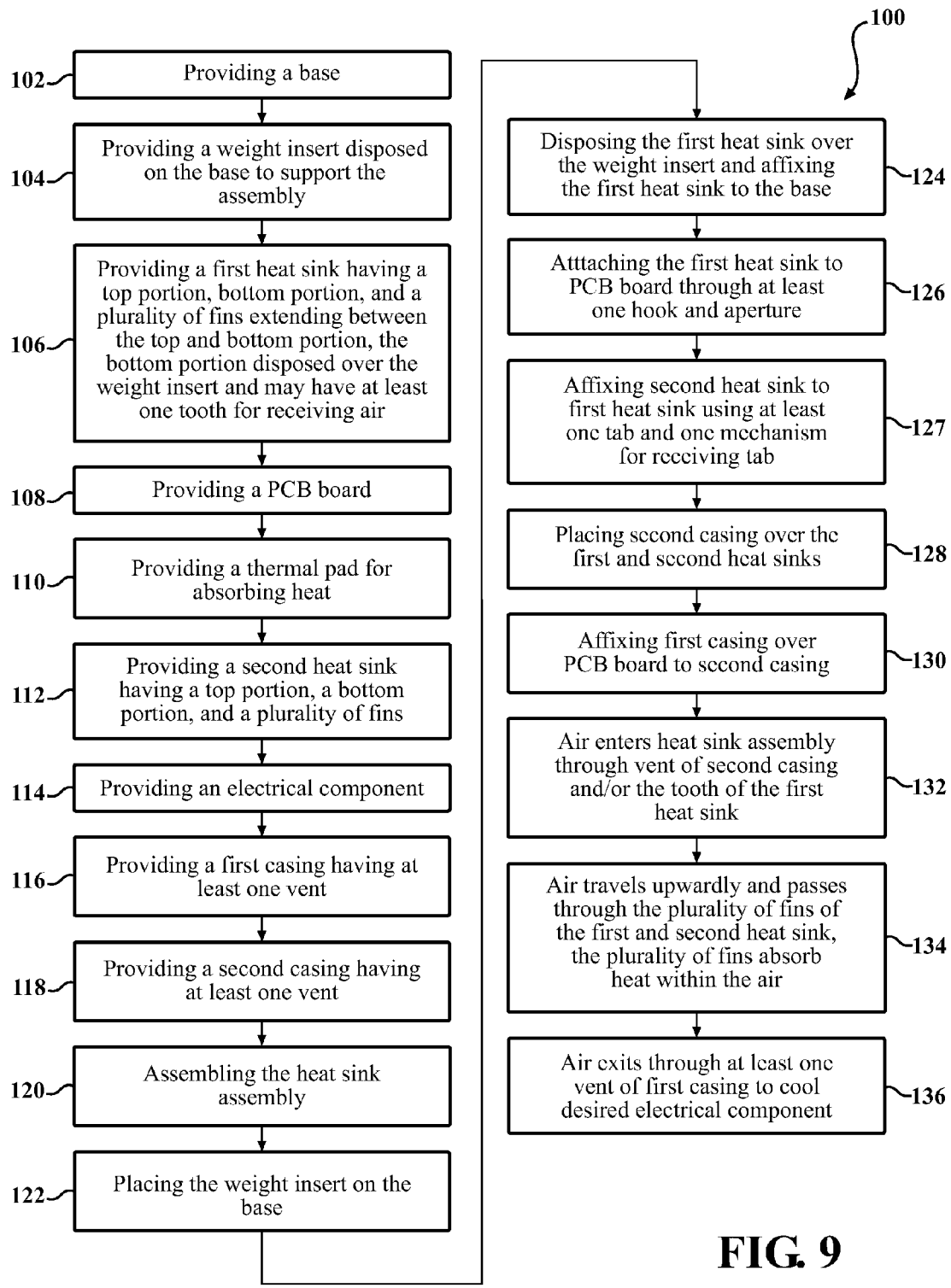
FIG. 9 is an illustration of a method in accordance with the present disclosure.

FIG. 9 is a flowchart of a method for cooling electronics utilizing a heat sink assembly 100 in accordance with the present disclosure. The method may include providing a generally circular base to support the assembly 102 and providing a weight insert disposed on the generally circular base to support the assembly 104. The weight insert may have an aperture for receiving a cable holder and cable. The method may also include providing a first heat sink having a top portion and a bottom portion 106. The bottom portion of the first heat sink may have a generally circular shape and may be disposed on the weight insert and affixed to the base. The bottom portion may also have at least one tooth for receiving air. The first heat sink may have a plurality of fins extending upwardly between the bottom portion and the top portion for absorbing heat as the air passes through. The plurality of fins may be made of a thermally conductive material. Additionally, at least one hook may be extending from and may be formed integrally with the top portion of the first heat sink. The at least one hooks may be a plurality of hooks. Furthermore, the first heat sink may have at least one mechanism for receiving a tab or locking mechanism.

The method may also include providing a PCB board 108. The PCB board may have at least one aperture for receiving the at least one hook of the first heat sink. The PCB board can also have an antenna contact or another electronics contact for communication with an antenna or other desired electrical component. At least one thermal pad may also be provided for absorbing heat 110. The method can further include providing a second heat sink 112, providing an electrical component such as but not limited to an antenna 114, providing a first casing having at least one vent 116, and providing a second casing having at least one vent 118. The second heat sink, like the first heat sink, may have a plurality of fins for absorbing heat as air passes there through extending from a top portion and a bottom portion of the second heat sink. Additionally, the second heat sink may have at least one tab or locking mechanism which may be located on at least one side and/or on the bottom portion of the second heat sink assembly. The first casing may be designed to house an electrical component or components. For example, the first casing may be an infrared lens and antenna case for housing the electrical component. Additionally, the at least one vent may be a plurality of vents for releasing air passed through the heat sink assembly. With respect to the second casing, the second casing may have a generally frusto-conical shape and may have at least one vent for receiving air to pass through the heat sink assembly. The at least one vent may be a plurality of vents.

In one aspect, the method may include assembling the heat sink assembly 120 which can include placing the weight insert on the base 122 and disposing the first heat sink over the weight insert and affixing the first heat sink to the base 124. The first heat sink may then be attached to the PCB board through placing the at least one hook through the at least one aperture of the PCB board 126. The second heat sink may then be affixed to the first heat sink through placing the at least one tab or locking mechanism to the at least one mechanism for receiving a tab or locking mechanism 127. The first heat sink and the second heat sink may form a generally frusto-conical or cylindrical shape. Additionally, the at least one thermal pad may be disposed between the PCB board and one of the first heat sink and the second heat sink for absorbing heat as air passed through the heat sink assembly.

The method may further include placing the second casing over the first heat sink and second heat sink 128. This may include affixing the second casing to the base. The first casing may then be affixed to the second casing creating a frusto-conical shaped heat sink assembly 130.

Once the heat sink assembly is assembled 120, air may enter the heat sink assembly through the at least one vent located within the second casing and/or may enter through the at least one tooth 132. The air may then pass through the plurality of fins of both the first heat sink and second heat sink 134, where the plurality of fins absorbs heat within the air. Then the air may exit through the at least one vent of the first casing to cool a desired electrical component 136.

While examples of the disclosure have been illustrated and described, it is not intended that these examples illustrate and describe all possible forms of the disclosure. Rather, the words used in the specification are words of description rather than limitation, and it is understood that various changes may be made without departing from the spirit and scope of the disclosure. Additionally, the features and various implementing embodiments may be combined to form further examples of the disclosure.

What is claimed:

1. A heat sink assembly, comprising:
a first heat sink having a top portion, a bottom portion, and a plurality of fins extending between the top portion and the bottom portion, the bottom portion having at least one tooth depression to receive air, the first heat sink having at least one fastener terminal to receive a fastener;
a second heat sink having a top portion, a bottom portion, and a plurality of fins extending between the top portion and the bottom portion, the second heat sink having at least one fastener configured to engage the at least one fastener terminal of the first heat sink;

a casing disposed over the first heat sink and the second heat sink, the casing having a top portion and a bottom portion, the bottom portion having at least one vent to receive air and the top portion having at least one vent to release air;

wherein air is received through at least one of the at least one tooth of the first heat sink or the at least one vent of the bottom portion of the casing and wherein air flows upwardly through the plurality of fins of the first heat sink and second heat sink and heat is absorbed by the plurality of fins, wherein the air flows to the top portion of the casing and through the at least one vent of the casing to release air to cool a desired electrical component, and at least one thermal pad disposed between at least one of printed circuit board (PCB board) and the first heat sink or the PCB board and the second heat sink for absorb heat as air passes through the plurality of fins of the first heat sink and the second heat sink.

2. The heat sink assembly of claim 1, wherein the first heat sink includes at least one hook extending outwardly from the top portion of the first heat sink.

3. The heat sink assembly of claim 2, further comprising:
a PCB board having at least one aperture to receive the at least one hook extending outwardly from the top portion of the first heat sink.

4. The heat sink assembly of claim 3, wherein the PCB board is disposed between the first heat sink and the second heat sink.

5. The heat sink assembly of claim 2, wherein the at least one hook comprises additional hooks.

6. The heat sink assembly of claim 2, further comprising:
a weight insert disposed on the base to support the heat sink assembly.

7. The heat sink assembly of claim 1, wherein the at least one tooth is comprises additional teeth.

8. The heat sink assembly of claim 1, wherein the at least one tooth has a saw-tooth shape.

9. The heat sink assembly of claim 1, further comprising:
a base, wherein the first heat sink is affixed to the base.

10. A heat sink assembly, comprising
a heat sink having a top portion, a bottom portion, and a plurality of fins extending upwardly between the top portion and the bottom portion, the bottom portion having at least one tooth depression to receive air;
a casing disposed over the heat sink, the casing having a top portion and a bottom portion, the bottom portion having at least one vent to receive air and the top portion having at least one vent to release air;
wherein air is received through at least one of the at least one tooth of the heat sink or the at least one vent off the bottom portion of the casing and wherein air flows upwardly through the plurality of fins of the heat sink and heat is absorbed by the plurality of fins and wherein the air flows to the top portion of the casing and through the at least one vent to release air to cool a desired electrical component.

11. The heat sink assembly of claim 10, wherein the heat sink includes a first heat sink portion and a second heat sink portion.

12. The heat sink assembly of claim 10, wherein the casing includes a first casing portion and a second casing portion.

13. The heat sink assembly of claim 10, wherein the plurality of fins is made of a thermal conductive material.

14. A method of utilizing a heat sink assembly, comprising:
providing a first heat sink having a top portion, a bottom portion, at least one lock catch to receive a lock, and a plurality of fins extending between the top portion and the bottom portion, the bottom portion having at least one tooth depression to receive air;
providing a casing disposed over the first heat sink, the casing having a top portion and a bottom portion, the bottom portion having at least one vent to receive air and the top portion having at least one vent to release air;
wherein the first heat sink assembly is configured to receive air through one of the at least one vent of the bottom portion of the casing and the at least one tooth of the bottom portion of the first heat sink, and wherein air flows upwardly through the plurality of fins of the heat sink to the top portion of the casing and through the at least one vent of the casing to cool a desired electrical component; and
a second heat sink having at least one lock for affixing the second heat sink to the first heat sink.

15. The method of claim 14, wherein the first heat sink has at least one hook extending upwardly from the top portion of the first heat sink.

16. The method of claim 15, further comprising:
a PCB board having at least one aperture for receiving the at least one hook of the first heat sink.

17. The method of claim 16, further comprising:
assembling the heat sink assembly by placing the at least one hook of the first heat sink through the at least one aperture of the PCB board.

18. The method of claim 17, wherein assembling the heat sink includes engaging the at least one lock of the second heat sink with the at least one lock catch to receive the lock of the first heat sink to affix the first heat sink to the second heat sink.

* * * * *